(12) United States Patent
Ukita

(10) Patent No.: US 6,661,095 B2
(45) Date of Patent: Dec. 9, 2003

(54) SEMICONDUCTOR DEVICE

(75) Inventor: Motomu Ukita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/222,791

(22) Filed: Aug. 19, 2002

(65) Prior Publication Data

US 2003/0157811 A1 Aug. 21, 2003

(30) Foreign Application Priority Data

Feb. 20, 2002 (JP) ........................................ 2002-042916

(51) Int. Cl.⁷ ............................ H01L 23/48; H01L 23/62
(52) U.S. Cl. .................... 257/758; 257/748; 257/750; 257/774; 257/358
(58) Field of Search ............................. 257/358, 359, 257/363, 379, 508, 748, 750, 758, E29.204, 904, 774, 775

(56) References Cited

U.S. PATENT DOCUMENTS 6,281,536 B1 * 8/2001 Shinohara et al. .......... 257/295
6,320,241 B1 * 11/2001 Okamoto ..................... 257/528
6,399,999 B2 * 6/2002 Hoashi ........................ 257/575

FOREIGN PATENT DOCUMENTS

| JP | 5-36902 | * 2/1993 | ............... 257/538 |
| JP | 5-109988 | * 4/1993 | ............... 257/538 |
| JP | 9-321229 | 12/1997 | |
| JP | 11-177023 | 7/1999 | |
| JP | 11-243176 | 9/1999 | |
| JP | 2000-49284 | 2/2000 | |

* cited by examiner

Primary Examiner—Jasmine Clark
(74) Attorney, Agent, or Firm—McDermott, Will & Emery

(57) ABSTRACT

The structure around a high-resistance element is formed in mirror symmetry to a plane perpendicular to a semiconductor substrate and the surface of the sheet. Specifically, high-resistance element, contact plugs and extending portion of interconnection layers are symmetric, each of the interconnection layers covering high-resistance element by the same amount. Thus, a semiconductor device of which degree of freedom on designing layout of interconnections which is to be connected to interconnection layers electrically connected to the high-resistance element via contact plugs can be attained.

16 Claims, 11 Drawing Sheets

SEMICONDUCTOR DEVICE

BACKGROUND OF THE INVENTION

1. Field of the Invention

The present invention relates to a semiconductor device using a high-resistance element, and more specifically, to a semiconductor device in which a high-resistance element is used in an analog circuit.

2. Description of the Background Art

Conventionally, a high-resistance element has been used in an analog circuit of many LSI (Large Scale Integration) devices such as memory LSI devices. In the analog circuit, the characteristics of the high-resistance element significantly effect the operation of the circuit, often determining the characteristics of the LSI device itself.

As a representative example, in a reference potential Vref generating circuit, fluctuation of the resistance value of a high-resistance element may even changes the reference potential generated by the circuit.

In the following, portions of a conventional semiconductor device where a high-resistance element is used will be described referring to top views or cross-sectional views of FIGS. 16 to 18.

As shown in FIGS. 16 to 18, a conventional semiconductor device using a high-resistance element includes a well 101 doped with N type impurity, an element separating insulation film 102 formed from a main surface of the well 101 to the prescribed depth, a high-resistance element 103 consisting of a diffusion layer of P type impurity and surrounded by the element separating insulation film 102, contact plugs 104a and 104b connected to the high-resistance element 103, an interlayer insulation film 105 in which the contact plugs 104a and 104b are buried, interconnection layer 106a formed on the interlayer insulation film 105 and connected to the contact plug 104a, an interconnection layer 106b connected to the contact plug 104b, an interlayer insulation film 107 formed to cover the interconnection layers 104a and 104b respectively, and an upper interconnection layer 108 formed on the interlayer insulation film 107.

As shown in FIGS. 16 to 18, resistance value of the high resistance element 103 is determined by resistance value per unit area and dimension of the P type impurity diffusion layer. For example, the resistance value R of the high-resistance element 103 may be expressed as follows:

$$R = R_p \times L/W$$

where $R_p$ is resistance value per unit area of the P type impurity diffusion layer, L is the length of the P type impurity diffusion layer, and W is the width of the P type impurity diffusion layer. When R is constant, the resistance value of the high-resistance element 103 fluctuates corresponding to the degree of effect, as indicated by arrows 125 in FIG. 18, from changes in potential of the upper interconnection layer 108.

More specifically, the structure shown in FIG. 18 including the upper interconnection layer 108, interlayer insulation films 105, 107, and the high-resistance element 103 is similar to the structure of an MOS transistor including a gate electrode, a gate insulation film and a channel region. As such, fluctuation of the potential of upper interconnection layer 108 between "H" and "L" changes state of charges distributed in high-resistance element 103 configured with P type impurity diffusion layer. As a result, the resistance value of high-resistance element 103 changes, which in turn changes the amount of current flowing through high-resistance element 103.

One possible technique to solve the above mentioned problem is a structure in which interconnection layer 106b is formed to substantially cover the region above high-resistance element 103, as shown in FIGS. 19 to 21. According to the structure, even when the amount of current flowing through upper interconnection layer 108 changes, the portion of interconnection layer 106b formed above high-resistance element 103 suppresses electrical effect of the upper interconnection layer 108 as indicated by arrows 125. Thus, the resistance value of high-resistance element 103 is prevented from fluctuation.

Specifically, in a semiconductor device shown in FIGS. 19 to 21, interconnection layer 106b extends to the region between the contact plug 104a and contact plug 104b directly above the high-resistance element 103. Thus, the interconnection layer 106b shields high-resistance element 103 from the effect from changes in potential of the upper interconnection layer 108. It is accomplished by the fact that the potential of the upper interconnection layer 106b does not fluctuate as that of the upper interconnection layer 108 and is always identical to that of the contact plug 104b connected to high-resistance element 103.

In the above mentioned semiconductor device, however, the extending length of interconnection layer 106a and that of interconnection layer 106b are different. In other words, the interconnection layer 106a and the interconnection layer 106b are asymmetric to high-resistant element 103. Thus, electric effects on the resistance value of high-resistance element 103 caused by interconnection layer 106a and that caused by interconnection layer 106b are different. Therefore, depending on whether an interconnection layer electrically connected to the high potential electrode side is connected to interconnection layers 106a or 106b, the resistance value of high-resistance element 103, and in effect the amount of the current flowing therethrough, will be different. As a result, on designing a semiconductor device, there has been a limitation on degree of freedom in the layout of an interconnection layer connected to the high potential electrode side, which is to be electrically connected to high-resistance element 103 via interconnection layers 106a and 106b.

SUMMARY OF THE INVENTION

The object of the present invention is to provide a semiconductor device with improved degree of freedom on designing layout of an interconnection layer electrically connected to a high-resistance element, or an interconnection connected to conductive unit, via contact plugs.

A semiconductor device using a resistance element according to a first aspect of the present invention includes a semiconductor substrate, a resistance element formed above or within the semiconductor substrate, an interlayer insulation film formed on the resistance element, a first contact hole penetrating vertically the interlayer insulation film and connected to the resistance element, a second contact hole penetrating vertically the interlayer insulation film and connected to the resistance element, a first interconnection layer formed on the interlayer insulation film and connected to the first contact hole, and a second interconnection layer formed on the interlayer insulation film and connected to the second contact hole. And above the region between the first and second contact holes, the first and the second interconnection layers are formed symmetrical to the prescribed plane perpendicular to the semiconductor substrate, or formed into layers of identical thickness and at the same height and in point symmetry on a prescribed plane parallel to the semiconductor substrate.

According to the above structure, above the region between the first and second contact holes, respective electrical effects to the resistance value of the resistance element by the first and the second interconnection layers become equivalent, thus the degree of freedom is improved on designing interconnection layers respectively connected to the first and second interconnection layers.

A semiconductor device using a resistance element according to a second aspect of the present invention includes a semiconductor substrate, a resistance element formed above the semiconductor substrate, an interlayer insulation film formed under the resistance element, a first contact hole penetrating vertically the interlayer insulation film and connected to the resistance element, a second contact hole penetrating vertically the interlayer insulation film and connected to the resistance element, a first conductive unit formed under the interlayer insulation film and connected to the first contact hole, and a second conductive unit formed under the interlayer insulation film and connected to the second contact hole. And under the region between the first and the second contact holes the first and the second conductive units are formed symmetrical to the prescribed plane perpendicular to the semiconductor substrate, or formed into layers of identical thickness and at the same height and in point symmetry on a prescribed plane parallel to the semiconductor substrate.

According to the above structure, under the region between the first and second contact holes, respective electrical effects to the resistance value of the resistance element by the first and the second conductive units become equivalent, thus the degree of freedom is improved on designing interconnection layers respectively connected to the first and second conductive units.

A semiconductor device using a resistance element according to a third aspect of the present invention includes a semiconductor substrate, a resistance element formed above the semiconductor substrate, a first interlayer insulation film formed under the resistance element, a second interlayer insulation film formed on the resistance element, a first conductive unit formed under the first interlayer insulation film, a second conductive unit formed under the first interlayer insulation film and not being identical to the first conductive unit, a third conductive unit formed on the second interlayer insulation film, a fourth conductive unit formed on the second interlayer insulation film and not being identical to the third conductive unit, a first contact hole penetrating vertically the first and the second interlayer insulation films and connected to the first and the third conductive units, a second contact hole penetrating vertically the first and the second interlayer insulation films and connected to the second and the fourth conductive units, a third contact hole penetrating vertically the second interlayer insulation film and connected to the resistance element and the third conductive unit, and a fourth contact hole penetrating vertically the second interlayer insulation film and connected to the resistance element and the fourth conductive unit. And under the region between the first and the second contact holes, the first and the second conductive units are formed symmetrical to the prescribed plane perpendicular to the semiconductor substrate, or formed into layers of identical thickness and at the same height and in point symmetry on a prescribed plane parallel to the semiconductor substrate, and above the region between the third and the fourth contact holes, the third and the fourth conductive units are formed symmetrical to the prescribed plane perpendicular to the semiconductor substrate, or formed into layers of identical thickness and at the same height and in point symmetry on a prescribed plane parallel to the semiconductor substrate.

According to the above structure, under the region between the first and second contact holes, respective electrical effects to the resistance value of the resistance element by the first and the second conductive units become equivalent, thus the degree of freedom is improved on designing interconnection layers respectively connected to the first and second conductive units. Similarly, under the region between the third and the fourth contact holes, respective electrical effects to the resistance value of the resistance element by the third and the fourth conductive units become equivalent, thus the degree of freedom is improved on designing interconnection layers respectively connected to the third and the fourth conductive units.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
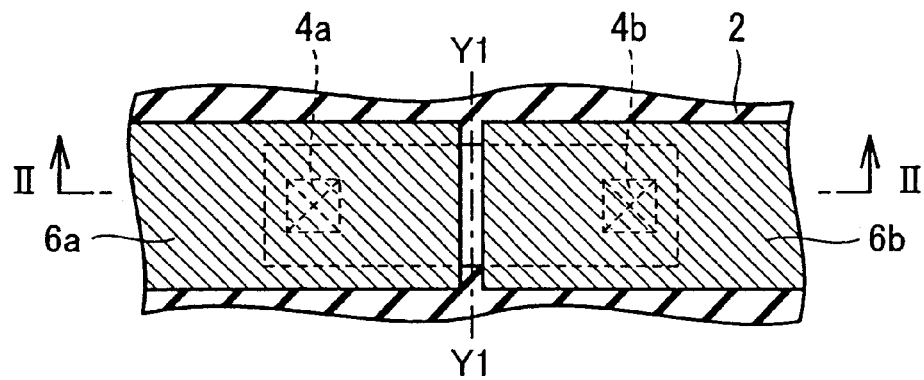
FIG. 1 is a top view illustrating the high-resistance element unit and surrounding structure of a semiconductor device of a first embodiment.
Figure 2:
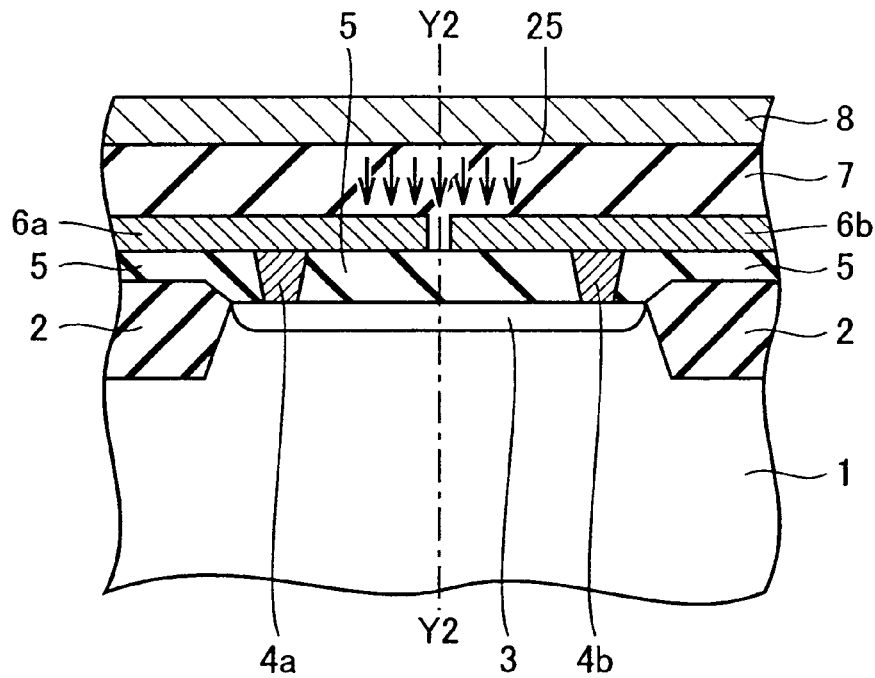
FIG. 2 is a cross sectional view along the line II—II.

First, referring to FIGS. 1 and 2, a semiconductor device using a high-resistance element of a first embodiment is described. As shown in FIGS. 1 and 2, the semiconductor device using a high-resistance element of the present embodiment includes a well 1 doped with N type impurity, a separating insulation film 2 formed from the main surface of the well 1 to a prescribed depth, a high-resistance element 3 formed from the main surface of the well 1 to a prescribed depth and surrounded by the separating insulation film 2 as well as having a P type impurity diffusion layer, two contact plugs 4a and 4b connected to the high-resistance element 3, an interlayer insulation film 5 to which the contact plugs 4a and 4b are buried, interconnection layers 6a and 6b contacting the contact plugs 4a and 4b and formed on the interlayer insulation film 5, an interlayer insulation film 7 formed to cover the interconnection layers 6a and 6b, and an upper interconnection layer 8 formed on the interlayer insulation film 7.

Further, in the semiconductor device including the high-resistance element of the present invention, the interconnection layers 6a and 6b are formed to substantially cover a region above the high-resistance element 3. Thus, even when the amount of current flowing through the upper interconnection layer 8 changes, extending portions of interconnection layers 6a and 6b above high-resistance element 3 suppress the electrical effect of the upper interconnection layer 8 as indicated by arrows 25. Thus, the fluctuation of the resistance value of the high-resistance element 3 is suppressed even when the potential of the upper interconnection layer 8 changes.

Specifically, in the semiconductor device of the present embodiment, the interconnection layers 6a and 6b shield the high-resistance element 3 from the effect of fluctuating potential of the upper interconnection layer 8. The potential of the interconnection layers 6a and 6b are always identical to that of the contact plug 4a and 4b connected to the high-resistance element 3 and does not fluctuate as the upper interconnection layer 8. Thus, the difference between the potential of the interconnection layers 6a and 6b and that of the high-resistance element 3 is constant. Thus, the resistance value of the high-resistance element 3 becomes more stable than that of conventional semiconductor device.

In FIG. 1, line Y1—Y1 is shown between extending tips of interconnection layers 6a and 6b. The line Y1—Y1 is perpendicular to a line connecting centers of the contact plugs 4a and 4b, at its mid point on a plane shown in FIG. 1.

In FIG. 2, line Y2—Y2 is shown between extending tips of interconnection layers 6a and 6b. The line Y2—Y2 is perpendicular to the main surface of the semiconductor substrate, and dividing equally the distance between centers of the contact plugs 4a and 4b in the cross section shown in FIG. 2.

The structure around the high-resistance element 3 of the semiconductor device of the present embodiment is formed in mirror symmetries to a plane including line Y1—Y1 shown in FIG. 1 and a line Y2—Y2 shown in FIG. 2. That is, the high-resistance element 3, contact plugs 4a and 4b, and interconnection layers 6a and 6b are symmetrical in both FIGS. 1 and 2, and the interconnection layers 6a and 6b respectively cover the high-resistance element 3 by the same length.

Additionally, the high-resistance elements 3 are usually arranged in a group/groups at one point or at a plurality of points to reduce variation in fabrication precision. Further, the high-resistance element 3 is often arranged at a certain distance from other circuits 50 and 60 or any other elements to reduce the effect thereof.

The area between the high-resistance element 3 and other elements can not be utilized to place any elements, wasting the space. To reduce the wasted area, high-resistance element 3 should be grouped at one point. Additional high-resistance element 3 is often arranged as well, providing for changes of the characteristics of the high-resistance element 3 and modification of other circuits 50 and 60 performed in the subsequent process of designing the semiconductor device.

Figure 3:
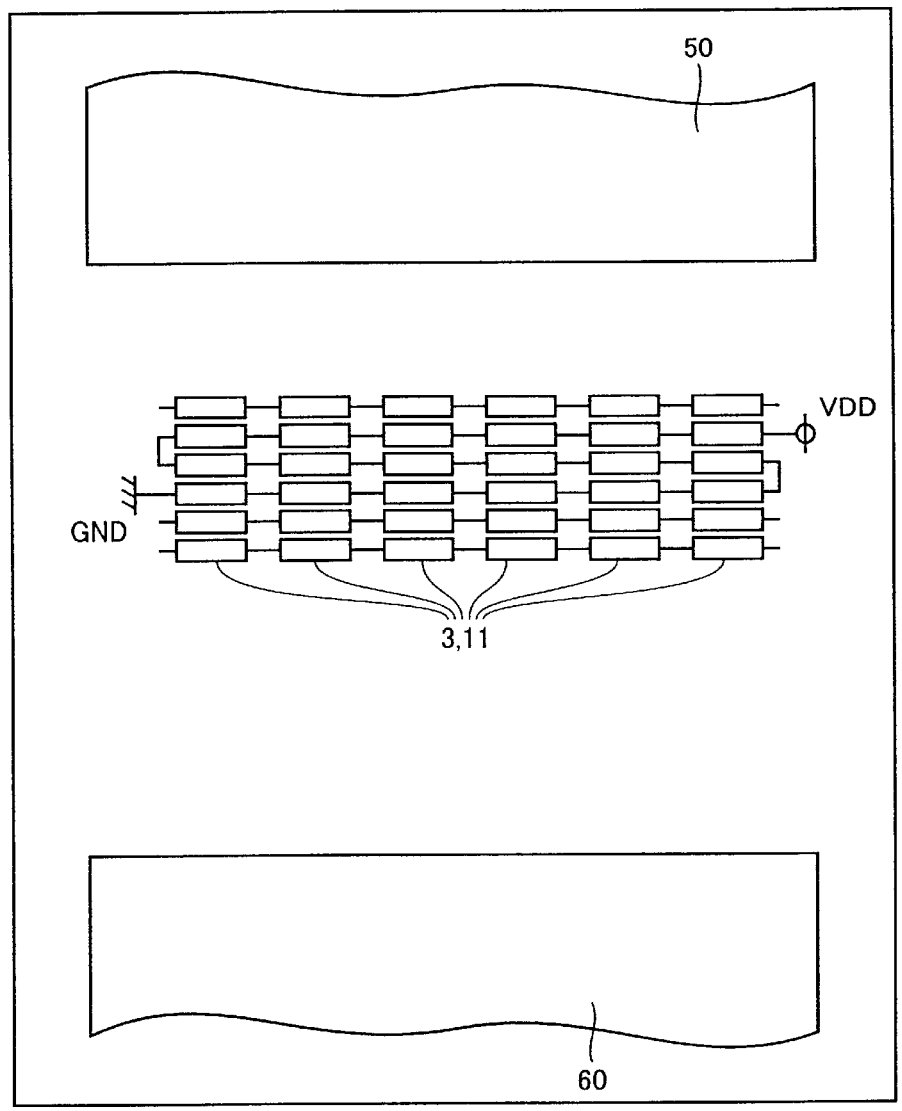
FIG. 3 illustrates a structure of high-resistance elements connected in series.
Figure 4:
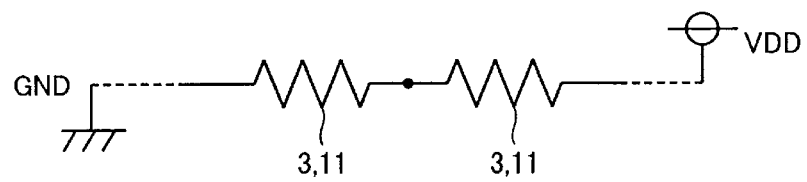
FIG. 4 illustrates the structure of FIG. 3 with circuit symbols.

In the semiconductor device, when using a plurality of high-resistance elements as connected into one resistance element, for example, it is effective to serially connect each high-resistance element, as shown in FIGS. 3 and 4. When using a high-resistance element 3 (or a high-resistance element layer 11 discussed later) of the present embodiment as the high-resistance element of the present invention, circuit diagram showing connection state between each high-resistance element 3 will be as shown in FIG. 4. The structure connecting serially each high-resistance element shown in FIGS. 3 and 4 are applicable to all of high-resistance element of each of embodiments described below.

Figure 5:
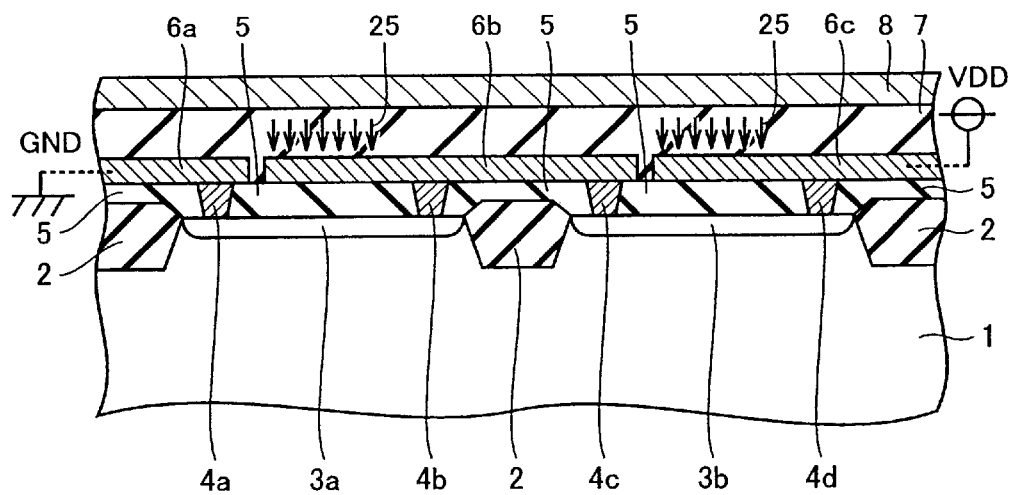
FIGS. 5 to 6 are cross sectional views illustrating semiconductor devices using exemplary high-resistance elements used in a first embodiment.
Figure 6:
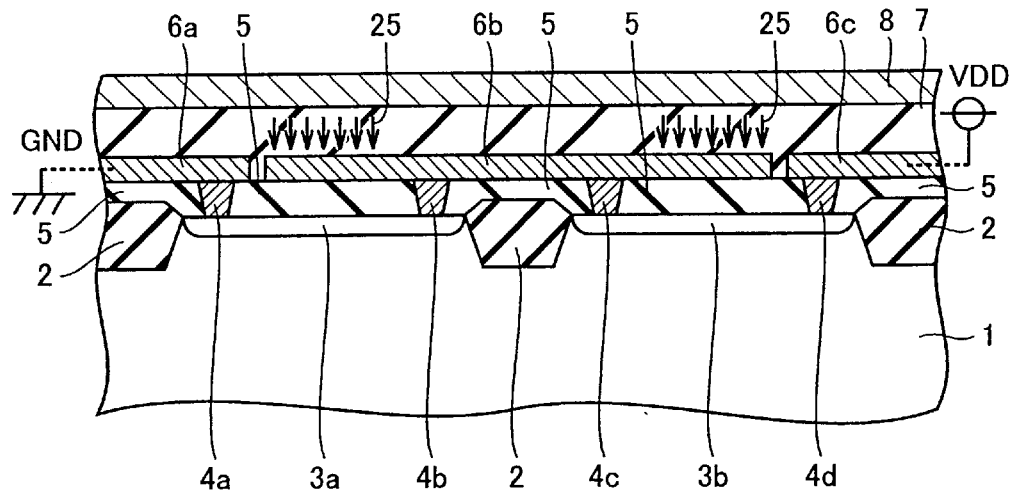
Figure 7:
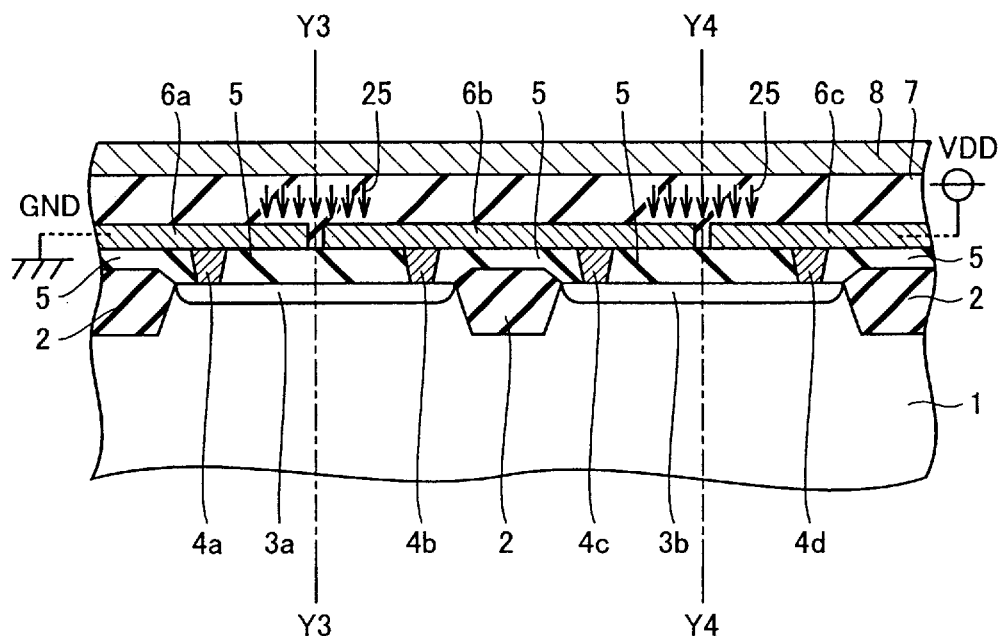
FIG. 7 is a cross sectional view illustrating semiconductor devices using another exemplary high-resistance elements of the first embodiment.

As above mentioned structure in which interconnection layers 6a and 6b shield the high-resistance element 3, variations of structures as described below referring to FIGS. 5 to 7 are possible.

First, one possible structure is shown in FIG. 5, in which intervals between the interconnection layers 6a and 6b, and 6b and 6c are respectively arranged closer to ground potential GND than to reference potential VDD relative to the respective middle portions of high-resistance element 3a and 3b.

Another possible structure is shown in FIG. 6, in which an interval between the interconnection layers 6a and 6b and another interval between the interconnection layers 6b and 6c are positioned in different relation relative to the centers of the high-resistance element 3a and 3b, respectively.

Another possible structure is a pair of extending tips of interconnection layers respectively covering a high-resistance element by the same length. For example, in semiconductor of the present embodiment shown in FIG. 7, a structure in which extending tips of interconnection layers 6a and 6b cover high-resistance element 3a by the same length, while opposite extending tip of interconnection layer 6b and extending tip of interconnection layer 6c cover high-resistance element 3b by the same length.

The structure shown in FIG. 7 in which a plurality of high-resistance elements are connected in series can be appreciated as a structure in which a plurality of units of elements are repetitively arranged, where each of the units is identical in shape and material and defined as including a high-resistance element, two contact plugs connected to the high-resistance element, and two interconnection layers corresponding to the two contact plugs.

The inventors of the present invention found that in the structure where a pair of interconnections cover a high-resistance element by the same length, such as shown in FIG. 7, has following advantages.

As described in the description of background art, high-resistance element 3a is affected not only by potential changes of upper interconnection layer 8 formed above as a channel area of an MOS transistor, but also by interconnection layers 6a and 6b. In other words, both of upper interconnection layer 8 and interconnection layers 6a and 6b contribute to changes in resistance value of high-resistance element 3a. Additionally, high-resistance element 3b is affected not only by potential changes of upper interconnection layer formed above as a channel area of an MOS transistor, but by interconnection layers 6b and 6c. In other words, both of upper interconnection layer 8 and interconnection layers 6b and 6c contributes to changes in resistance value of high-resistance element 3b.

In a semiconductor device of the present embodiment using high-resistance element shown in FIG. 5, interconnection layers 6b and 6c function as gate electrodes of an MOS transistor, and the gate electrodes are connected to contact plugs 4b and 4d which in turn function as source or drain electrodes. Further, in a semiconductor device using high-resistance element as shown in FIG. 6, interconnection layer 6b functions as gate electrode of an MOS transistor, and the gate electrodes are connected to contact plugs 4b and 4c which in turn function as source or drain electrodes. Thus, the high-resistance elements and surrounding structure shown in FIGS. 5 and 6 is similar to that of a transistor in which gate electrode and source electrode or drain electrode are in a short circuit. As a result, depending on which of interconnection layers 6a, 6b or 6c is connected to an electrode of higher potential, a structural difference arises similar to the difference between a gate electrode connected to a source electrode and a gate electrode connected to a drain electrode.

Because of the difference between the resistance values of high-resistance element 3a and 3b corresponding to the structural difference, amount of current flowing through high-resistance elements 3a and 3b will be different. This determines, upon designing a semiconductor device using high-resistance element as shown in FIG. 6, to which interconnection layers 6a, 6b or 6c connected to high resistance element 3a an interconnection layer connected to an electrode of higher potential is to be connected. Thus, a limitation is placed on the layout of the interconnection layers to be connected to interconnection layers 6a, 6b and 6c.

Therefore, in the semiconductor device using a plurality of high-resistance element of the present embodiment, each of high-resistance elements must be structured as shown in FIG. 7. In FIG. 7, a line Y3—Y3 running vertically between tips of interconnection layers 6a and 6b is illustrated. The line Y3—Y3 is perpendicular to a main surface of semiconductor substrate in FIG. 7 which shows a cross sectional view, equally dividing the distance between contact plugs 4a and 4b. Additionally in FIG. 7, a line Y4—Y4 running vertically between tips of interconnection layers 6b and 6c is illustrated. The line Y4—Y4 is perpendicular to a main surface of semiconductor substrate in FIG. 7 which shows a cross sectional view, equally dividing the distance between contact plugs 4b and 4c.

In the structure shown in FIG. 7, high-resistance element 3a, contact plugs 4a and 4b and interconnection layers 6a and 6b are formed in mirror symmetry to a plane including line Y3—Y3 and perpendicular to the surface of the sheet.

Further, in the structure shown in FIG. 7, high-resistance element 3b, contact plugs 4c and 4d and interconnection layers 6b and 6c are formed in mirror symmetry to a plane includes line Y4—Y4 and perpendicular to the surface of the drawing.

Thus, having one of a plurality of units in symmetry to a prescribed plane per unit, where each of the units includes high-resistance element 3a and 3b, contact plugs 4a, 4b, 4c, and 4d, and interconnection layers 6a, 6b, and 6c, the effects on resistance value of high-resistance element by interconnection layers 6a, 6b and 6c can be equivalent. Therefore, the degree of freedom on designing layout of interconnection layers for connecting to respective interconnection layers 6a, 6b and 6c can be improved.

Second Embodiment

Next, referring to FIG. 8, a semiconductor device using a high-resistance element of a second embodiment will be described.

The semiconductor device using a high-resistance element of the second embodiment includes an interlayer insulation film 10 formed above a semiconductor substrate, a high-resistance element layer 11 including polysilicon formed on the interlayer insulation film 10, contact plugs 4a and 4b formed to connect to the high-resistance element layer 11, an interlayer insulation film 5 to which the high-resistance element layer 11 and the contact plugs 4a and 4b are buried, interconnection layers 6a and 6b formed on the interlayer insulation film 5 for connecting to the contact plugs 4a and 4b, an interlayer insulation film 7 formed to cover the interconnection layer 6a and 6b, and an upper interconnection layer 8 formed on the interlayer insulation film 7.

Similar to the semiconductor device using the high-resistance element of the first embodiment, in the structure mentioned above, the high-resistance element layer 11 is shielded by the interconnection layers 6a and 6b to prevent the effect of the fluctuating potential of the upper interconnection layer 8 formed on the interconnection layers 6a and 6b via the interlayer insulation film 7. As a result, potential of the high-resistance element layer 11 does not fluctuate, thus the resistance value of the high-resistance element layer 11 becomes more stable than that of a conventional semiconductor device.

Figure 8:
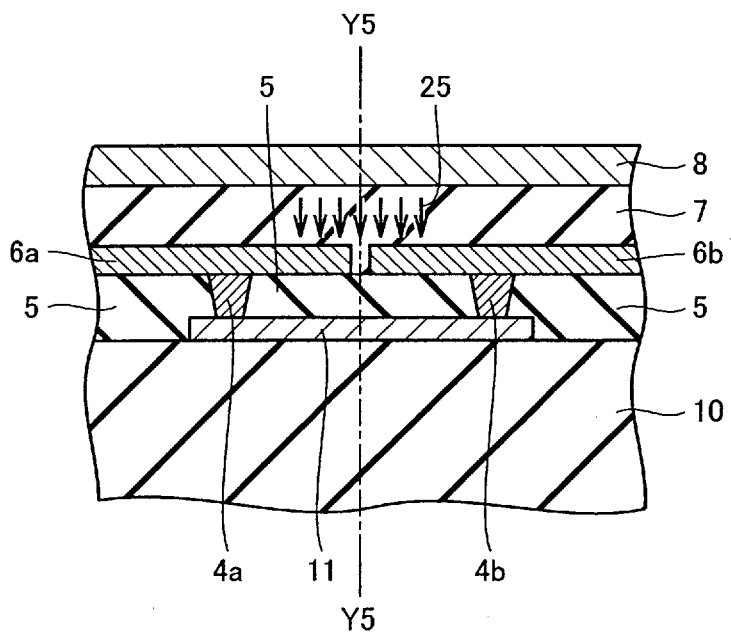
FIG. 8 is a cross sectional view illustrating semiconductor device using high-resistance element of a second embodiment.

In FIG. 8, a line Y5—Y5 running vertically between tips of interconnection layers 6a and 6b is illustrated. The line Y5—Y5 is perpendicular to a main surface of semiconductor substrate in FIG. 8 which shows a cross sectional view, dividing the distance equally between contact plugs 4a and 4b.

In the structure shown in FIG. 8, high-resistance layer 11, contact plugs 4a and 4b and interconnection layers 6a and 6b are formed in mirror symmetry to a plane including line Y5—Y5 and perpendicular to the surface of the sheet.

Therefore, similar to the semiconductor device of the first embodiment, the degree of freedom on designing layout of interconnection layers for connecting to respective interconnection layers 6a and 6b can be improved.

Third Embodiment

Next, referring to FIG. 9, a semiconductor device using a high-resistance element of a third embodiment will be described.

Figure 9:
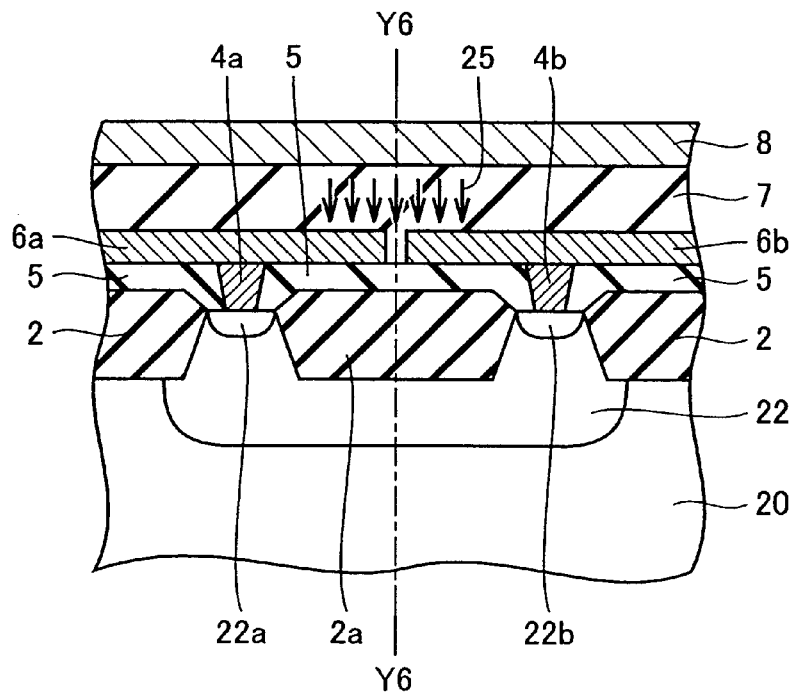
FIG. 9 is a cross sectional view illustrating semiconductor device using high-resistance element of a third embodiment.

As shown in FIG. 9, the semiconductor device using the high-resistance element of the present embodiment includes an N⁻ type well 22 formed within a P⁻ type well 20 to function as a high-resistance element, a separating insulation film 2 formed to surround the N⁻ type well 22, an insulation film 2a formed within the N⁻ type well 22, P⁺ type impurity diffusion layers 22a and 22b formed in a region without the separating insulation film 2 and the insulation film 2a and from the main surface of the N⁻ type well 22 to the prescribed depth, contact plugs 4a and 4b connecting to the P⁺ type impurity diffusion layers 22a and 22b, an interlayer insulation film 5 formed to bury the separating insulation film 2 and the contact plugs 4a and 4b, interconnection layers 6a and 6b formed to connect to the contact plugs 4a and 4b, an interlayer insulation film 7 formed to cover the interconnection layers 6a and 6b, and an upper interconnection layer 8 formed on the interlayer insulation film 7.

In the above mentioned structure as well, the effect by upper interconnection layer 8 to N⁻ type well 22 is suppressed by interconnection layers 6a and 6b. Therefore, resistance value of N⁻ type well 22 becomes stable.

In FIG. 9, a line Y6—Y6 running vertically between tips of interconnection layers 6a and 6b is illustrated. The line Y6—Y6 is perpendicular to a main surface of semiconductor substrate in FIG. 9 which shows a cross sectional view, dividing the distance equally between contact plugs 4a and 4b. In the semiconductor device using the high-resistance element of the present embodiment, N⁻ type well 22, contact plugs 4a and 4b and interconnection layers 6a and 6b are formed in mirror symmetry to a plane including line Y6—Y6 shown in FIG. 9 and perpendicular to the surface of the sheet.

Therefore, similar to the semiconductor device of the first and the second embodiments, the degree of freedom on designing layout of interconnection layers connected to respective interconnection layers 6a and 6b can be improved.

Fourth Embodiment

Next, referring to FIG. 10, a semiconductor device using a high-resistance element of a fourth embodiment will be described.

The semiconductor device using the high-resistance element of the present embodiment includes a lower interconnection layer 18 formed above a semiconductor substrate, an interlayer insulation film 10 formed on the lower interconnection layer 18, interconnection layers 16a and 16b formed on the interlayer insulation film 10, contact plugs 14a and 14b formed to connect to the interconnection layers 16a and 16b, an interlayer insulation film 15 formed to bury the contact plugs 14a and 14b and interconnection layers 16a and 16b, a high-resistance element layer 11 including polysilicon formed on the interlayer insulation film 15 to connect to the contact plugs 14a and 14b, contact plugs 4a and 4b formed to connect to the high-resistance element layer 11, an interlayer insulation film 5 formed to bury the high-resistance element layer 11 and the contact plugs 4a and 4b, interconnection layers 6a and 6b formed on the interlayer insulation film 5 to connect to the contact plugs 4a and 4b, an interlayer insulation film 7 formed to cover the interconnection layers 6a and 6b, and an upper interconnection layer 8 formed on the interlayer insulation film 7.

In the above mentioned structure as well, high-resistance element layer 11 is shielded by interconnection layers 6a and 6b to prevent the effect of upper interconnection layer 8 formed via upper interlayer insulation film 7. Further, high-resistance element layer 11 is shielded by interconnection layers 16a and 16b to prevent the effect of lower interconnection layer 18 formed via lower interlayer insulation film 10. As a result, potential in high-resistance element layer 11 does not fluctuate under the effects of interconnection layers formed above and below, thus the resistance value of high-resistance element layer 11 becomes more stable than that of a conventional semiconductor device.

Figure 10:
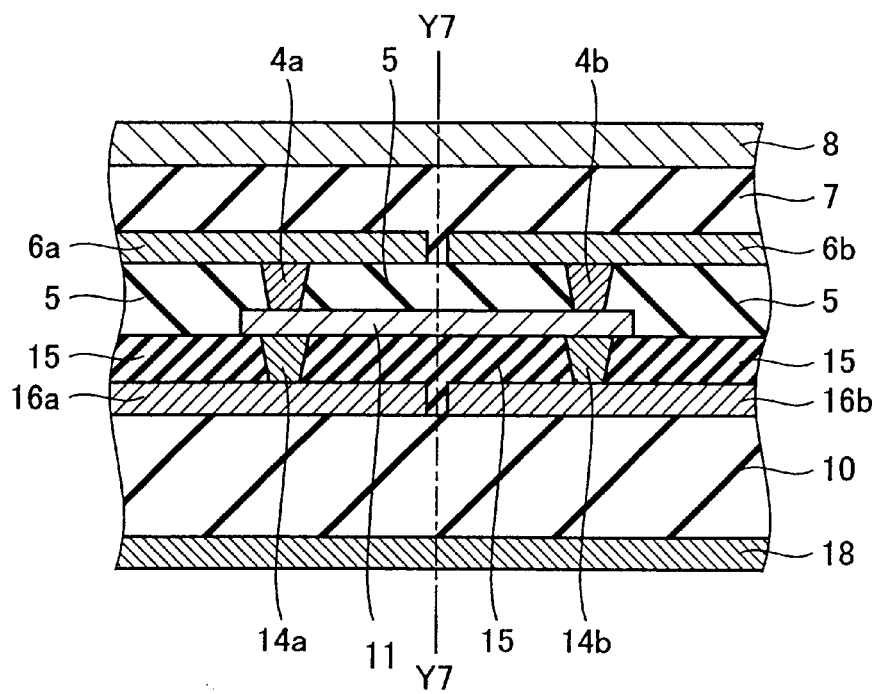
FIG. 10 is a cross sectional view illustrating semiconductor device using high-resistance element of a fourth embodiment.

In FIG. 10, a line Y7—Y7 running vertically between tips of interconnection layers 6a, 16a, and tips of interconnection layers 6b, 16b is illustrated. The line Y7—Y7 is perpendicular to a main surface of semiconductor substrate in FIG. 10 which shows a cross sectional view, dividing the distance equally between contact plugs 4a and 4b.

In the semiconductor device using the high resistance element of the present embodiment as shown in FIG. 10 includes high-resistance layer 11, contact plugs 4a and 4b and interconnection layers 6a and 6b are formed in mirror symmetry to a plane including line Y7—Y7 and perpendicular to the surface of the sheet.

Therefore, similar to the semiconductor device of any one of the first to third embodiments, the degree of freedom on designing layout of interconnection layers for connecting to respective interconnection layers 6a and 6b can be improved.

Fifth Embodiment

Next, referring to FIG. 11, a semiconductor device using a high-resistance element of a fifth embodiment will be described.

The semiconductor device using the high-resistance element of the present embodiment includes a lower interconnection layer 18 formed above a semiconductor substrate, an insulation film 10 formed on the lower interconnection layer 18, interconnection layers 16a and 16b formed on the insulation film 10, an interlayer insulation film 15 formed to bury interconnection layers 16a and 16b, a high-resistance element layer 11 including polysilicon formed on the interlayer insulation film 15, contact plugs 4a and 4b formed to connect to the high-resistance element layer 11, an interlayer insulation film 5 formed to bury the high-resistance element layer 11 and the contact plugs 4a and 4b, interconnection layers 6a and 6b formed on the interlayer insulation film 5 to connect to the contact plugs 4a and 4b, an interlayer insulation film 7 formed to cover the interconnection layers 6a and 6b, an upper interconnection layer 8 formed on the interlayer insulation film 7, and contact plugs 14a and 14b formed to connect to the interconnection layers 16a, 16b and the interconnection layers 6a, 6b through the interlayer insulation films 5, 15.

In the above mentioned structure as well, high-resistance element layer 11 is shielded by interconnection layers 6a and 6b to prevent the effect of upper interconnection layer 8 formed via upper interlayer insulation film 7. Further, high-resistance element layer 11 is shielded by interconnection layers 16a and 16b to prevent the effect of lower interconnection layer 18 formed via lower interlayer insulation film 10. As a result, potential in high-resistance element layer 11 does not fluctuate under the effects of interconnection layers formed above or below, thus resistance value of high-resistance element layer 11 becomes more stable than that of a conventional semiconductor device.

Figure 11:
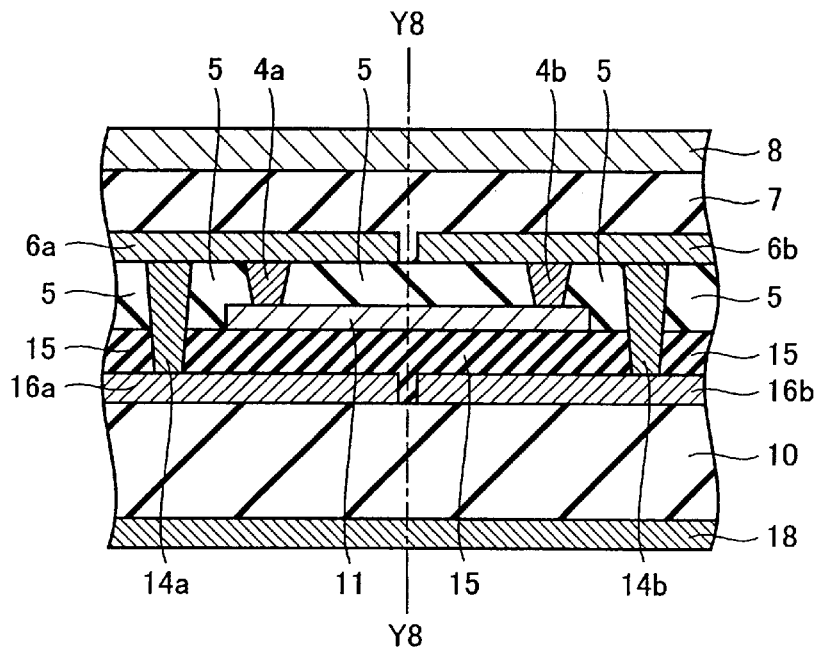
FIG. 11 is a cross sectional view illustrating semiconductor device using high-resistance element of a fifth embodiment.

In FIG. 11, a line Y8—Y8 running vertically between tips of interconnection layers 6a, 16a, and tips of interconnection layers 6b, 16b is illustrated. The line Y8—Y8 is perpendicular to a main surface of semiconductor substrate in FIG.

11 which shows a cross sectional view, dividing the distances equally between contact plugs 4a and 4b and that of contact plugs 14a and 14b, respectively.

In the semiconductor device using the high resistance element of the present embodiment as shown in FIG. 11, high-resistance layer 11, contact plugs 4a and 4b and interconnection layers 6a and 6b are formed in mirror symmetry to a plane including line Y8—Y8 and perpendicular to the surface of the sheet.

Therefore, similar to the semiconductor device of any one of the first to fourth embodiments, the degree of freedom on designing layout of interconnection layers for connecting to respective interconnection layers 6a and 6b can be improved.

In the semiconductor device using the high resistance element of the present embodiment as shown in FIG. 11, high-resistance layer 11, contact plugs 14a and 14b and interconnection layers 16a and 16b are formed in mirror symmetry to a plane including line Y8—Y8 and perpendicular to the surface of the sheet.

Therefore, similar to the semiconductor device of any one of the first to fourth embodiments, the degree of freedom on designing layout of interconnection layers for connecting to respective interconnection layers 16a and 16b can be improved.

Sixth Embodiment

Next, referring to FIG. 12, a semiconductor device using high-resistance element of a sixth embodiment will be described.

The semiconductor device using the high-resistance element of the present embodiment includes a well 1 formed within a semiconductor substrate and doped with N type impurity, another well 30 formed within the well 1, a separating insulation film 2 formed to surround this another well 30, an insulation film 2a formed within the well 1, impurity diffusion layers 26a and 26b formed within the well 1 and from the main surface thereof to the prescribed depth, an interlayer insulation film 15 formed on the impurity diffusion layers 26a and 26b, the insulation film 2a and the separating insulation film 2, a high-resistance element layer 11 including polysilicon formed on the interlayer insulation film 15, contact plugs 4a and 4b formed to connect to the high-resistance element layer 11, an interlayer insulation film 5 formed to bury the high-resistance element layer 11 and the contact plugs 4a and 4b, interconnection layers 6a and 6b formed on the interlayer insulation film 5 to connect to the contact plugs 4a and 4b, an interlayer insulation film 7 formed to cover the interconnection layers 6a and 6b, an upper interconnection layer 8 formed on the interlayer insulation film 7, and contact plugs 14a and 14b formed to connect to the interconnection layers 6a and 6b and the impurity diffusion layers 26a and 26b.

In the above mentioned structure as well, high-resistance element layer 11 is shielded by interconnection layers 6a and 6b to prevent the effect of fluctuating potential of upper interconnection layer 8 formed via upper interlayer insulation film 7. Further, the high-resistance element layer 11 is shielded by impurity diffusion layers 26a and 26b to prevent the effect of fluctuating potential of another well 30 formed via interlayer insulation film 10. As a result, potential in high-resistance element layer 11 does not fluctuate under other conductive units formed above or below, thus resistance value of high-resistance element layer 11 becomes more stable than that of a conventional semiconductor device.

Figure 12:
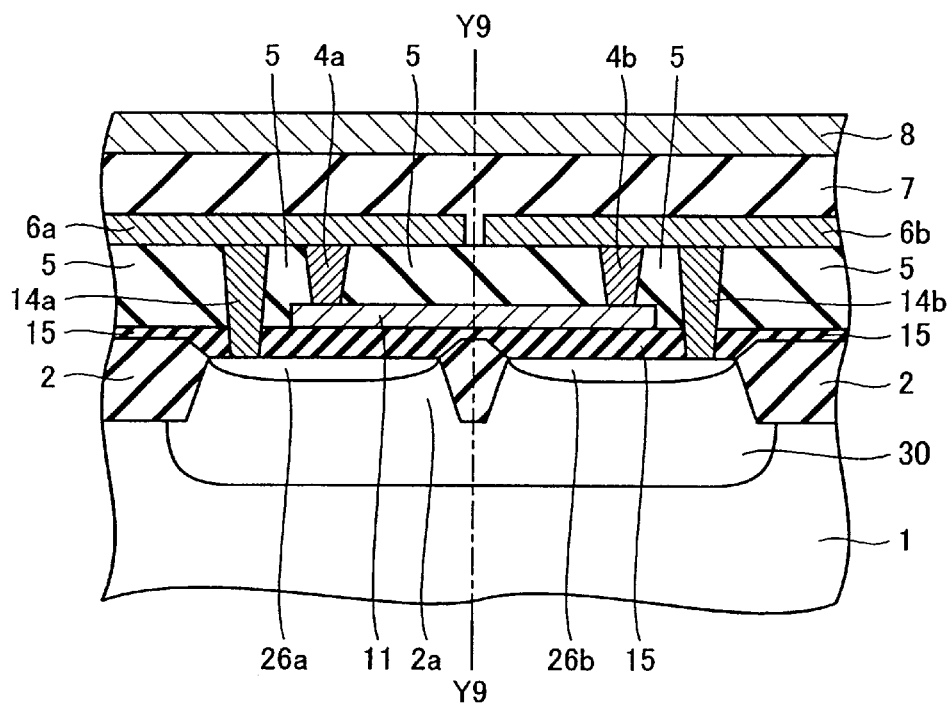
FIG. 12 is a cross sectional view illustrating semiconductor device using high-resistance element of a sixth embodiment.

In FIG. 12, a line Y9—Y9 running vertically between tips of interconnection layer 6a and impurity diffusion layer 26a, and that of interconnection layer 6b and impurity diffusion layer 26b is illustrated. The line Y9—Y9 is perpendicular to a main surface of semiconductor substrate in FIG. 12 which shows a cross sectional view, dividing equally the distance between contact plugs 4a and 4b, and that of contact plugs 14a and 14b, respectively. In the semiconductor device using the high resistance element of the present embodiment as shown in FIG. 12, high-resistance layer 11, contact plugs 4a, 4b, contact plugs 14a, 14b, impurity diffusion layers 26a, 26b and interconnection layers 6a, 6b are formed in mirror symmetry to a plane including line Y9—Y9 and perpendicular to the surface of the sheet.

Therefore, similar to the semiconductor device of any one of the first to fifth embodiments, the degree of freedom on designing layout of interconnection layers for connecting to respective interconnection layers 6a, 6b and impurity diffusion layers 26a, 26b can be improved.

Seventh Embodiment

Next, referring to FIGS. 13 to 15, a semiconductor device using high-resistance element of a seventh embodiment will be described.

The semiconductor device using the high-resistance element of the present embodiment includes a well 1 doped with N type impurity and formed in a semiconductor substrate, another well 30 formed in the well 1, an separating insulation film 2 formed to surround the well 30, a high-resistance element 3 formed in the region surrounded by the separating insulation film 2 and to the prescribed depth from a main surface of the semiconductor substrate, contact plugs 4a and 4b formed to connect to the high-resistance element 3, an interlayer insulation film 5 formed to bury the high-resistance element region 3 and the contact plugs 4a and 4b, interconnection layers 6a and 6b formed on the interlayer insulation film 5 to connect to the contact plugs 4a and 4b, an interlayer insulation film 7 formed to cover the interconnection layers 6a and 6b, and an upper interconnection layer 8 formed on the interlayer insulation film 7.

In the above mentioned structure as well, high-resistance element 3 is shielded by interconnection layers 6a and 6b to prevent the effect of fluctuating potential of upper interconnection layer 8 formed via upper interlayer insulation film 7. As a result, potential of high-resistance element 3 will not fluctuate relative to the fluctuation of the potential of the upper interconnection layer 8, thus resistance value thereof becomes more stable than that of a conventional semiconductor device.

Figure 13:
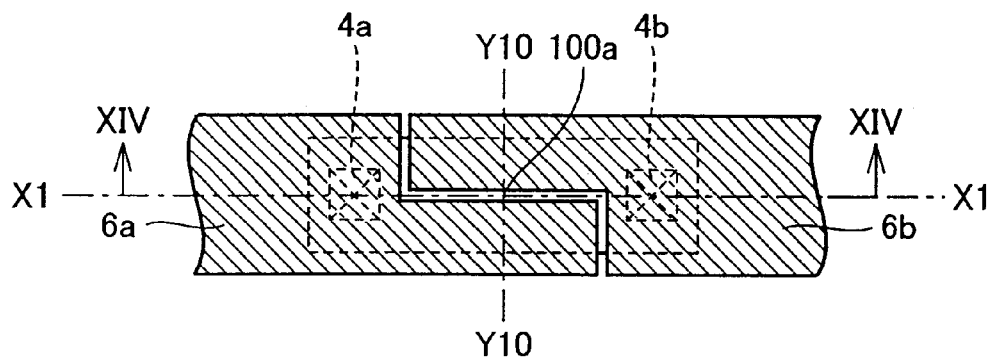
FIG. 13 is a cross sectional view illustrating semiconductor device using high-resistance element of a seventh embodiment.

In FIG. 13, a line X1—X1 and a line Y10—Y10 are shown. The line X1—X1 ties the centers of contact plugs 4a and 4b on a plane shown in FIG. 13. Further, the line Y10—Y10 is perpendicular to the line X1—X1 and divide it at its mid point.

Figure 14:
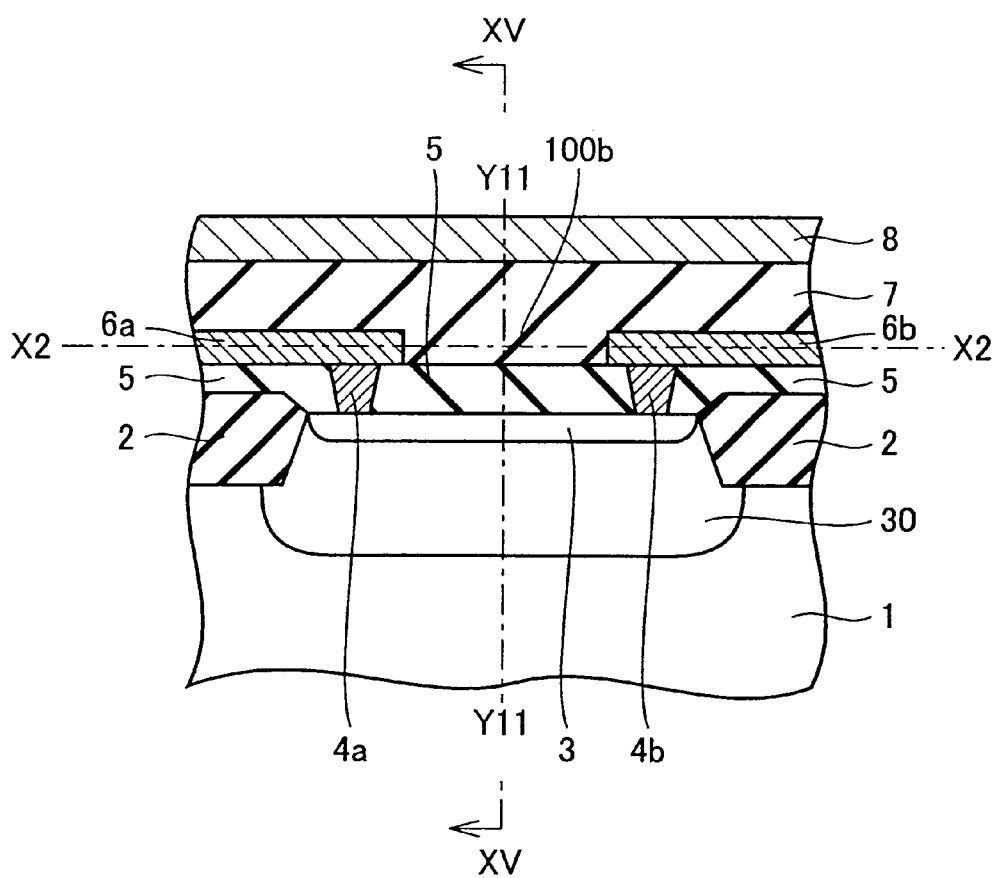
FIG. 14 is a cross sectional view along the line XIV—XIV of FIG. 13.

In FIG. 14, a line X2—X2 and a line Y11—Y11 are shown. The line X2—X2 equally divides the thickness of interconnection layers 6a and 6b and is parallel to the main surface of the semiconductor substrate. The line Y11—Y11 is perpendicular to a main surface of a semiconductor substrate and equally divides a distance between tips of interconnection layers 6a and 6b in the cross sectional view of FIG. 14.

Figure 15:
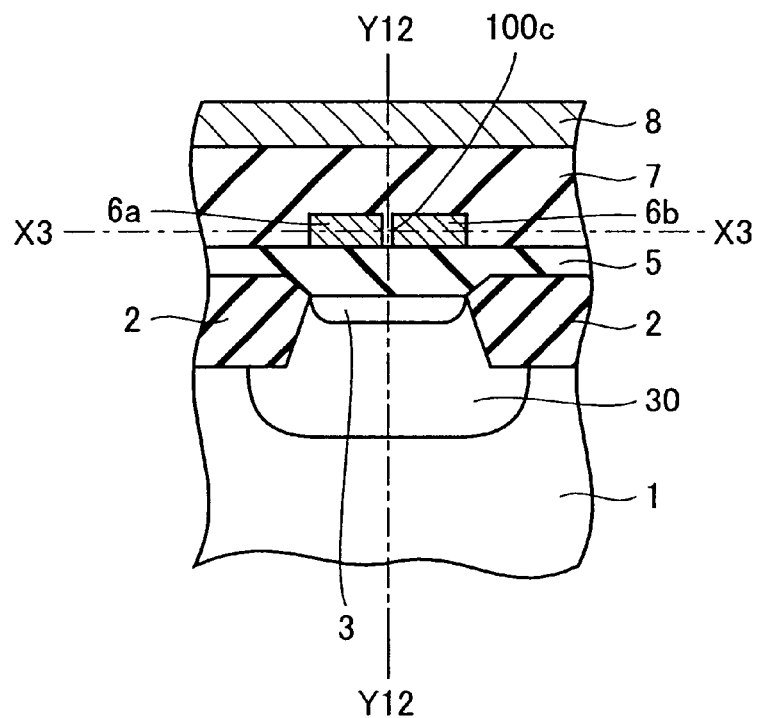
FIG. 15 is a cross sectional view along the line XV—XV of FIG. 14.
Figure 16:
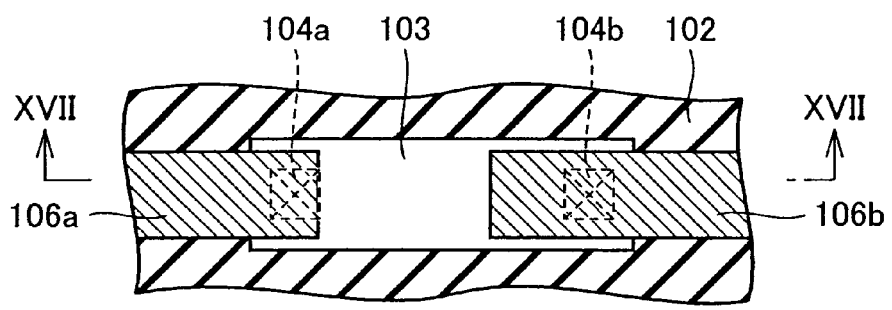
FIG. 16 is a top view of a structure surrounding high-resistance element unit of a conventional semiconductor device.
Figure 17:
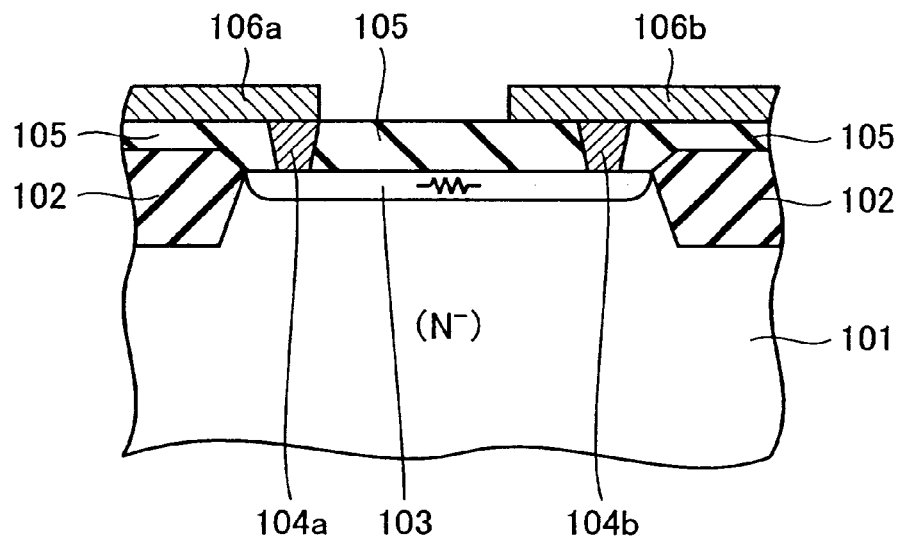
FIG. 17 is a cross sectional view along the line XVII—XVII of FIG. 16.
Figure 18:
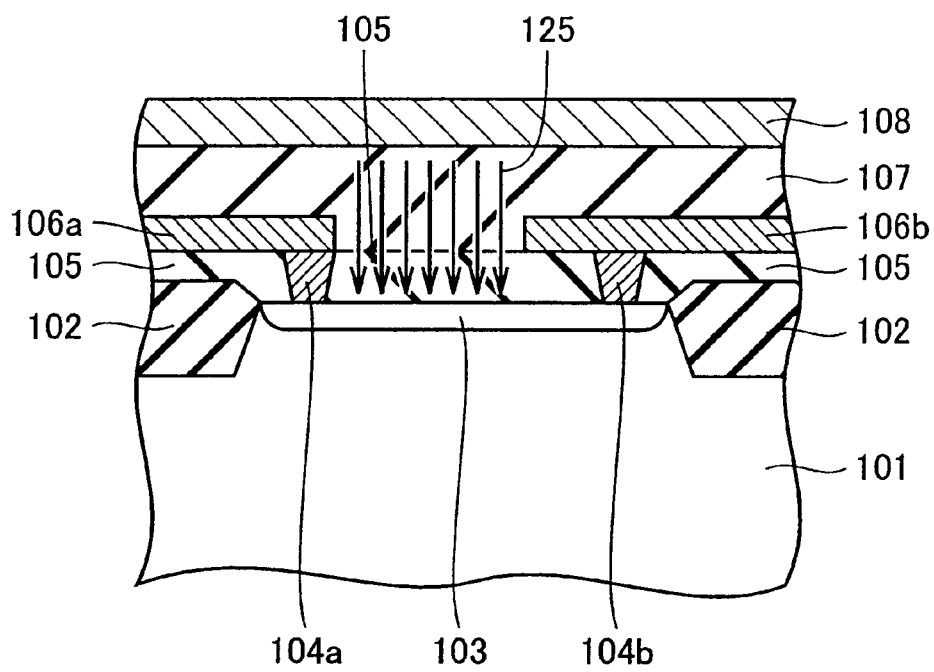
FIG. 18 illustrates effect of fluctuating potential of an upper interconnection layer to a high-resistance element of a conventional semiconductor device.
Figure 19:
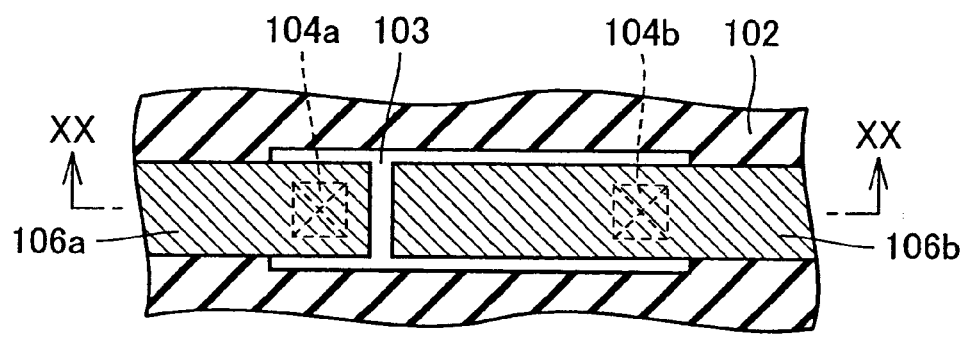
FIG. 19 is a top view illustrating a surrounding structure of high-resistance element unit of a conventional semiconductor device using a high-resistance element.
Figure 20:
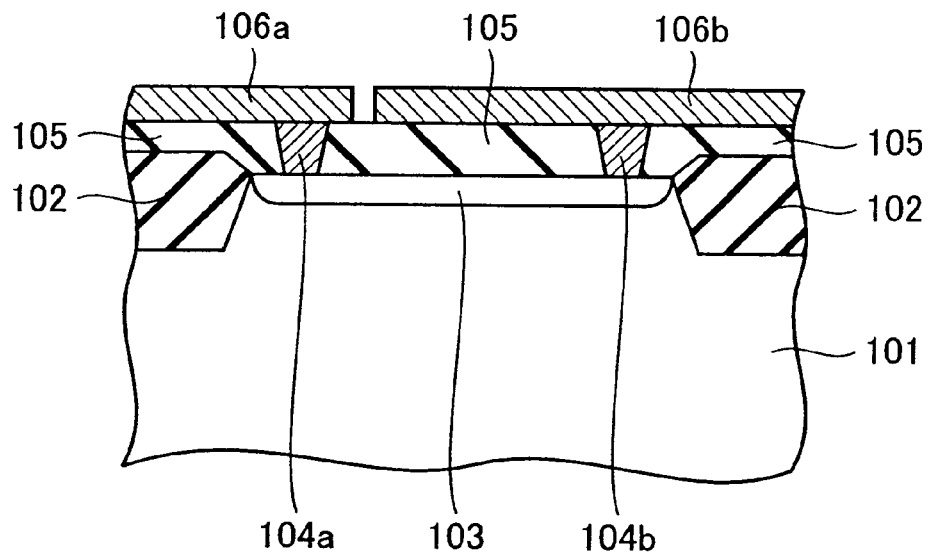
FIG. 20 is a cross sectional view along the line XX—XX of FIG. 19.
Figure 21:
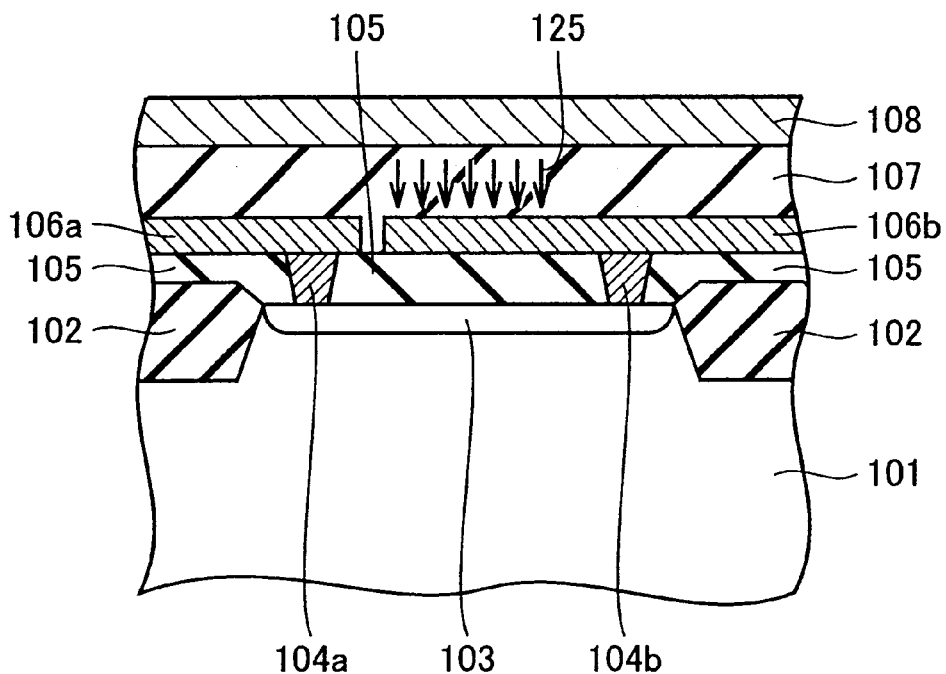
FIG. 21 illustrates a conventional semiconductor device using a high-resistance element in which an effect of an upper interconnection layer thereon is suppressed.

In FIG. 15, a line X3—X3 and a line Y12—Y12 are shown. The line X3—X3 equally divides the thickness of interconnection layers 6a and 6b and is parallel to the main surface of the semiconductor substrate. The line Y12—Y12 is perpendicular to a main surface of a semiconductor substrate and equally divides a distance between tips of interconnection layers 6a and 6b in the cross sectional view of FIG. 15.

The line X1—X1 of FIG. 13 and the line X2—X2 of FIG. 14 are one identical line in an actual semiconductor device. The line Y11—Y11 of FIG. 14 and the line Y12—Y12 of FIG. 15 are also one identical line in an actual semiconductor device. The line Y10—Y10 of FIG. 13 and the line X3—X3 of FIG. 15 are also one identical line in an actual semiconductor device. Thus, an intersection point 100a of X1—X1 and Y10—Y10 of FIG. 13, an intersection point 100b of X2—X2 and Y11—Y11 of FIG. 14, and an intersection point 100c of X3—X3 and Y12—Y12 of FIG. 15, are one identical point in an actual semiconductor device.

Therefore in the semiconductor device using a high-resistance element of the present embodiment as shown in FIGS. 13 to 15, the interconnection layers 6a and 6b are formed in point symmetry to a point A, where the point A is the identical intersection point 100a, 100b and 100c.

In other words, in the top view as shown in FIG. 13, the interconnection layers 6a and 6b are in point symmetry to the intersection 100a.

In the cross sectional view as shown in FIG. 14, the interconnection layers 6a and 6b are formed in mirror symmetry to the plane parallel to the main surface of the semiconductor device including the line X2—X2. The high-resistance element 3, contact plugs 4a and 4b, and interconnection layers 6a and 6b are formed in mirror symmetry to the plane including the line Y11—Y11 and perpendicular to the surface of the sheet.

In the cross sectional view as shown in FIG. 15, the interconnection layers 6a and 6b are formed in mirror symmetry to the plane parallel to the main surface of the semiconductor device including the line X3—X3. The high-resistance element 3 and interconnection layers 6a and 6b are formed in mirror symmetry to the plane including the line Y12—Y12 and perpendicular to the main surface of the semiconductor substrate.

Thus, above the region between the contact plugs 4a and 4b, the interconnection layers 6a and 6b are formed into layers of the same thickness and at the same height from the main surface of the semiconductor substrate and in point symmetry as seen on a top view.

Therefore, in the region between the contact plugs 4a and 4b, the interconnection layer 6a and 6b are arranged above the high-resistance element 3 so that electric effects thereon becomes equivalent. As such, similar to the semiconductor devices of above mentioned embodiments, the semiconductor device of the present embodiment permits higher degree of freedom on designing layout of the interconnection layers connected respective interconnections 6a and 6b.

Further, in order to attain the same effect, the structure of the present embodiment, in which the interconnection layers 6a and 6b are formed into layers of the same thickness and at the same height from the main surface of the semiconductor substrate and in point symmetry as seen in a top view, above the region between the contact plugs 4a and 4b, can be applied to the interconnection layers 6a, 6b, 16a, 16b, P+ type impurity diffusion layer 22a, 22b or impurity diffusion layers 26a, 26b of above mentioned first to sixth embodiments, respectively.

Meanwhile, in each of the first to seventh embodiments, contact plugs 4a and 4b, contact plugs 14a and 14b, interconnection layers 6a and 6b, interconnection layers 16a and 16b, P+ type impurity diffusion layers 22a and 22b, impurity diffusion layers 26a and 26b respectively are of the same material with identical electrical characteristics and are structured in the same form.

The above mentioned effect can be attained not only by the semiconductor devices using the high-resistance element of the first to seventh embodiments, but also by the semiconductor devices in which characteristics of each embodiment are combined.

Further, in the semiconductor devices of the first to seventh embodiments, the examples are shown by the contact plugs connected to the high-resistance element, in which different materials from the interconnection layers are buried in the holes formed through the insulation films, however, the same material with the interconnection layers may be buried in the holes, thus achieving the contact interconnection units integrally formed with the interconnection layers which is to be connected to the high-resistance element. It is noted that the contact holes as used herein refer both of such contact interconnection units and the contact plugs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a resistance element formed above or within said semiconductor substrate;

an interlayer insulation film formed on said resistance element a first contact hole penetrating said interlayer insulation film vertically and connected to said resistance element;

a second contact hole penetrating said interlayer insulation film vertically and connected to said resistance element;

a first interconnection layer formed on said interlayer insulation film and connected to said first contact hole; and a second interconnection layer formed on said interlayer insulation film and connected to said second contact hole; wherein above a region between said first contact hole and said second contact hole, said first interconnection layer and said second interconnection layer are formed not in symmetry to a prescribed plane perpendicular to said semiconductor substrate, but formed as layers of the same thickness at the same height and in point symmetry on a plane parallel to said semiconductor substrate.

2. The semiconductor device according to claim 1, wherein said resistance element is an impurity diffusion layer formed within said semiconductor substrate.

3. The semiconductor device according to claim 1, wherein said resistance element is an interconnection layer formed on said semiconductor substrate.

4. The semiconductor device according to claim 1, wherein an interval between said first interconnection layer and said second interconnection layer is set large enough for preventing electrical short therebetween, and is set large enough for suppressing an electric effect from an upper interconnection layer to said resistance element when said upper interconnection layer is provided in a region above said resistance element and further above said first interconnection layer and said second interconnection layer.

5. A semiconductor device, comprising:

a semiconductor substrate;

a resistance element formed above said semiconductor substrate;

an interlayer insulation film formed under said resistance element a first contact hole penetrating said interlayer insulation film vertically and connected to said resistance element;

a second contact hole penetrating said interlayer insulation film vertically and connected to said resistance element;

a first conductive unit formed under said interlayer insulation film and connected to said first contact hole; and a second conductive unit formed under said interlayer insulation film and connected to said second contact hole; wherein under a region between said first contact hole and said second contact hole, said first conductive unit and said second conductive unit are formed in symmetry to a prescribed plane perpendicular to said semiconductor substrate, or formed as layers of the same thickness at the same height and in point symmetry on a prescribed plane parallel to said semiconductor substrate.

6. The semiconductor device according to claim 5, wherein an interval between said first conductive unit and said second conductive unit is set large enough for preventing electrical short therebetween, and is set large enough for suppressing an electric effect from a lower interconnection layer to said resistance element when said lower interconnection layer is provided in a region below said resistance element and further below said first conductive unit and said second conductive unit.

7. A semiconductor device, comprising:

a semiconductor substrate;

a resistance element formed above said semiconductor substrate;

a first interlayer insulation film formed under said resistance element;

a second interlayer insulation film formed on said resistance element;

a first conductive unit formed under said first interlayer insulation film;

a second conductive unit formed under said first interlayer insulation film and not being identical to said first conductive unit;

a third conductive unit formed on said second interlayer insulation film;

a fourth conductive unit formed on said second interlayer insulation film and not being identical to said third conductive unit;

a first contact hole penetrating said first interlayer insulation film and second interlayer insulation film vertically and connected to said first conductive unit and said third conductive unit;

a second contact hole penetrating said first interlayer insulation film and second interlayer insulation film vertically and connected to said second conductive unit and said fourth conductive unit;

a third contact hole penetrating said second interlayer insulation film vertically and connected to said resistance element and said third conductive unit; and a fourth contact hole penetrating said second interlayer insulation film vertically and connected to said resistance element and said fourth conductive unit; wherein under a region between said first contact hole and said second contact hole, said first conductive unit and said second conductive unit are formed in symmetry to a prescribed plane perpendicular to said semiconductor substrate, or formed as layers at the same height and in point symmetry on a prescribed plane parallel to said semiconductor substrate, and above the region between the third and the fourth contact holes, the third and the fourth conductive units are formed symmetrical to the prescribed plane perpendicular to the semiconductor substrate, or formed into layers of identical thickness and at the same height and in point symmetry on a prescribed plane parallel to the semiconductor substrate.

8. The semiconductor device according to claim 7, wherein said first conductive unit and second conductive unit are impurity diffusion layers formed within said semiconductor substrate.

9. The semiconductor device according to claim 7, wherein said first conductive unit and second conductive unit are interconnection layers formed above said semiconductor substrate.

10. The semiconductor device according to claim 5, wherein said resistance element is an interconnection layer.

11. The semiconductor device according to claim 7, wherein an interval between said first conductive unit and said second conductive unit is set large enough for preventing electrical short therebetween, and is set large enough for suppressing an electric effect from a lower interconnection layer to said resistance element when said lower interconnection layer is provided in a region below said resistance element and further below said first conductive unit and said second conductive unit.

12. The semiconductor device according to claim 11, wherein said lower conductive unit is a well formed within said semiconductor substrate.

13. The semiconductor device according to claim 11, wherein said lower conductive unit is an interconnection layer formed on said semiconductor substrate.

14. A semiconductor device, comprising:

a semiconductor substrate;

a resistance element formed within said semiconductor substrate;

an interlayer insulation film formed on said resistance element a first contact hole penetrating said interlayer insulation film vertically and connected to said resistance element;

a second contact hole penetrating said interlayer insulation film vertically and connected to said resistance element;

a first interconnection layer formed on said interlayer insulation film and connected to said first contact hole; and a second interconnection layer formed on said interlayer insulation film and connected to said second contact hole; wherein above a region between said first contact hole and said second contact hole, said first interconnection layer and said second interconnection layer are formed in symmetry to a prescribed plane perpendicular to said semiconductor substrate, and said resistance element is an impurity diffusion layer formed within said semiconductor substrate.

15. The semiconductor device according to claim 14, wherein said resistance element is an interconnection layer formed on said semiconductor substrate.

16. The semiconductor device according to claim 14, wherein an interval between said first interconnection layer and said second interconnection layer is set large enough for preventing electrical short therebetween, and is set large enough for suppressing an electric effect from an upper interconnection layer to said resistance element when said upper interconnection layer is provided in a region above said resistance element and further above said first interconnection layer and said second interconnection layer.

* * * * *

UNITED STATES PATENT AND TRADEMARK OFFICE
CERTIFICATE OF CORRECTION

PATENT NO.      : 6,661,095 B2
DATED           : December 9, 2003
INVENTOR(S)     : Motomu Ukita It is certified that error appears in the above-identified patent and that said Letters Patent is hereby corrected as shown below:

<u>Title page</u>,
Item [73], Assignee, change "Mitsubishi Denki Kabushiki Kaisha, Tokyo (JP)" to
-- Renesas Technology Corp, Tokyo (JP) --

Signed and Sealed this

Sixth Day of April, 2004

JON W. DUDAS
*Acting Director of the United States Patent and Trademark Office*